(12) United States Patent
Collins et al.

(10) Patent No.: US 11,101,113 B2
(45) Date of Patent: Aug. 24, 2021

(54) ION-ION PLASMA ATOMIC LAYER ETCH PROCESS

(71) Applicant: Applied Materials, Inc., Santa Clara, CA (US)

(72) Inventors: Kenneth S. Collins, San Jose, CA (US); Kartik Ramaswamy, San Jose, CA (US); James D. Carducci, Sunnyvale, CA (US); Shahid Rauf, Pleasanton, CA (US); Leonid Dorf, San Jose, CA (US); Yang Yang, Los Gatos, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/595,339

(22) Filed: Oct. 7, 2019

(65) Prior Publication Data

US 2020/0035454 A1 Jan. 30, 2020

Related U.S. Application Data

(62) Division of application No. 14/660,531, filed on Mar. 17, 2015, now Pat. No. 10,475,626.

(51) Int. Cl.
*H01J 37/32* (2006.01)
*H01L 21/67* (2006.01)

(52) U.S. Cl.
CPC ...... *H01J 37/3255* (2013.01); *H01J 37/3233* (2013.01); *H01J 37/32357* (2013.01); *H01J 37/32422* (2013.01); *H01L 21/67213* (2013.01); *H01L 2224/85017* (2013.01)

(58) Field of Classification Search
CPC .............. H01J 37/3233; H01J 37/3255; H01J 37/32357; H01J 37/32422; H01L 21/67213; H01L 2224/85017; H01L 2224/85237
USPC ..................................................... 216/66, 94
See application file for complete search history.

(56) References Cited

U.S. PATENT DOCUMENTS

| | | |
|---|---|---|
| 4,844,775 A | 7/1989 | Keeble |
| 5,225,024 A | 7/1993 | Hanky et al. |
| 5,350,480 A | 9/1994 | Gray |
| 5,561,298 A | 10/1996 | Cirlin et al. |
| 5,674,321 A | 10/1997 | Pu et al. |
| 6,083,363 A | 7/2000 | Ashtiani et al. |
| 6,184,150 B1 | 2/2001 | Yang et al. |
| 6,429,445 B1 | 8/2002 | Kim et al. |
| 7,347,915 B1 | 3/2008 | Keil et al. |
| 7,510,666 B2 | 3/2009 | Walton |
| 7,780,864 B2 | 8/2010 | Paterson et al. |

(Continued)

FOREIGN PATENT DOCUMENTS

| | | |
|---|---|---|
| CN | 101242702 | 8/2008 |
| JP | 2001-085398 | 3/2001 |

(Continued)

OTHER PUBLICATIONS

TW Office Action in Taiwanese Application No. 105102158, dated Feb. 18, 2020, 9 pages.

(Continued)

*Primary Examiner* — Binh X Tran
(74) *Attorney, Agent, or Firm* — Fish & Richardson P.C.

(57) ABSTRACT

A method of etching uses an overhead electron beam source that generates an ion-ion plasma for performing an atomic layer etch process.

18 Claims, 12 Drawing Sheets

(56) References Cited

U.S. PATENT DOCUMENTS

| | | |
|---|---|---|
| 7,862,683 B2 | 1/2011 | Fakiage |
| 8,617,351 B2 | 12/2013 | Hoffman et al. |
| 9,159,606 B1 | 10/2015 | Purayath et al. |
| 9,508,530 B2 | 11/2016 | Dhindsa et al. |
| 9,633,846 B2 | 4/2017 | Paterson et al. |
| 2002/0185226 A1 | 12/2002 | Lea et al. |
| 2003/0032301 A1 | 2/2003 | Dhindsa et al. |
| 2004/0108470 A1 | 6/2004 | Ichiki et al. |
| 2004/0221815 A1 | 11/2004 | Fukuda et al. |
| 2004/0244687 A1 | 12/2004 | Lchiki et al. |
| 2005/0211543 A1 | 9/2005 | Chistyakov |
| 2005/0281958 A1 | 12/2005 | Walton et al. |
| 2006/0192150 A1 | 8/2006 | Demos et al. |
| 2006/0272772 A1 | 12/2006 | Al-Bayati et al. |
| 2007/0069118 A1 | 3/2007 | Economou |
| 2007/0084991 A1 | 4/2007 | Lee et al. |
| 2007/0119375 A1 | 5/2007 | Leonhardt et al. |
| 2007/0275569 A1 | 11/2007 | Moghadam et al. |
| 2008/0023653 A1 | 1/2008 | Lee et al. |
| 2008/0135518 A1 | 6/2008 | Chen et al. |
| 2008/0193673 A1 | 8/2008 | Paterson et al. |
| 2009/0084501 A1 | 4/2009 | Chen et al. |
| 2009/0095714 A1 | 4/2009 | Chen et al. |
| 2009/0236314 A1 | 9/2009 | Chen |
| 2009/0275207 A1 | 11/2009 | Honda et al. |
| 2009/0289179 A1 | 11/2009 | Chen et al. |
| 2010/0190098 A1 | 7/2010 | Walker et al. |
| 2011/0139748 A1 | 6/2011 | Donnelly et al. |
| 2011/0174606 A1* | 7/2011 | Funk ................ H01J 37/3233 204/164 |
| 2011/0177694 A1 | 7/2011 | Chen et al. |
| 2011/0192820 A1 | 8/2011 | Yeom et al. |
| 2011/0212624 A1 | 9/2011 | Hudson |
| 2012/0258607 A1* | 10/2012 | Holland ............ H01J 37/32357 438/798 |
| 2013/0059448 A1 | 3/2013 | Marakhtanov et al. |
| 2013/0098551 A1* | 4/2013 | Dorf ................ H01J 37/32082 156/345.4 |
| 2013/0098873 A1 | 4/2013 | Ramaswamy et al. |
| 2013/0133834 A1 | 5/2013 | Dhindsa |
| 2014/0151334 A1* | 6/2014 | Matsumoto ............ C01B 32/16 216/69 |
| 2014/0302681 A1 | 10/2014 | Paterson et al. |
| 2014/0360670 A1* | 12/2014 | Chen ................ H01J 37/32357 156/345.29 |
| 2015/0017810 A1 | 1/2015 | Ghua |
| 2016/0064244 A1* | 3/2016 | Agarwal ........... H01L 21/30655 438/712 |
| 2016/0276134 A1 | 9/2016 | Collins et al. |
| 2018/0261429 A1 | 9/2018 | Collins et al. |
| 2018/0277340 A1 | 9/2018 | Yang et al. |

FOREIGN PATENT DOCUMENTS

| | | |
|---|---|---|
| JP | 2006-502529 | 1/2006 |
| JP | 2006-114614 | 4/2006 |
| JP | 2008-515221 | 5/2008 |
| JP | 2008-252067 | 10/2008 |
| JP | 2008-544454 | 12/2008 |
| JP | 2010-116596 | 5/2010 |
| JP | 2012-529777 | 11/2012 |
| JP | 2013-012761 | 1/2013 |
| JP | 2014-513427 | 5/2014 |
| JP | 2014-239210 | 12/2014 |
| KR | 10-1001743 | 12/2010 |
| TW | 201340164 | 10/2013 |
| TW | 201507022 | 2/2015 |
| WO | WO 2010/090127 | 8/2010 |

OTHER PUBLICATIONS

Chinese Office Action in Application No. 201680024807.6, dated Nov. 15, 2018. 16 pages (with English translation).

Joslyn Barritt, Third-Party Submission Under 37 C.F.R. 1.290, May 31, 2019, U.S. Appl. No. 15/980,621.

JP Office Action in Japanese Application No. 2017-548944, dated Nov. 20, 2019. 59 pages (with English Translation).

Oiwa, "Reactive Etching," Special Reports, 2004, 59(8):22-25 (with English Abstract).

PCT International Search Report and Written Opinion in International Application No. PCT/US2016/013604, dated Apr. 27, 2016, 11 pages.

Walton et al., "Electron Beam Generated Plasmas for Ultra Low Te Processing," ECS J. Solid State Sci. Tech., 2015, 4(6):N5033-40.

JP Office Action in Japanese Application No. 2017-548944. dated Jul. 31, 2020, 4 pages (with English Translation).

* cited by examiner

ION-ION PLASMA ATOMIC LAYER ETCH PROCESS

CROSS-REFERENCE TO RELATED APPLICATIONS

This application is a divisional of and claims priority to U.S. application Ser. No. 14/660,531, filed on Mar. 17, 2015, the entire disclosure of which is incorporated by reference.

BACKGROUND

Technical Field

The disclosure concerns a plasma reactor for processing a workpiece such as a semiconductor wafer using an overhead electron beam source.

Background Discussion

Plasma sources for processing a workpiece can have an electron beam source having a beam path that is transverse to the cylindrical axis of symmetry of the plasma reactor. Such a transverse arrangement can introduce asymmetries into the processing, for which special features may be needed in the reactor to avoid such asymmetries.

There is a need for a plasma reactor having an electron beam plasma source in which there are no inherent asymmetries.

SUMMARY

An electron beam plasma reactor comprises: (1) an upper plasma chamber comprising: (a) a side wall, (b) a top electrode support comprising an electrically insulated electrostatic chuck and thermal control apparatus coupled to said top electrode support, (c) a top electrode thermally coupled to said top electrode support and having a top electrode surface, (d) an RF source power generator coupled to said top electrode or to said top electrode support or to an interior of said upper chamber, and a D.C chucking voltage source coupled to said electrically insulated electrostatic chuck, (e) a gas distributor, and (f) a grid filter facing said top electrode surface. The electron beam plasma reactor further comprises: (2) a lower plasma chamber, said grid filter separating said upper plasma chamber from said lower plasma chamber, said lower plasma chamber comprising: (a) a vacuum chamber body surrounding a processing region, and (b) a workpiece support pedestal comprising an electrically insulated electrostatic chuck and thermal control apparatus coupled to said workpiece support pedestal, and having a workpiece support surface facing said grid filter.

In one embodiment, the reactor further comprises a bias voltage generator coupled to workpiece support pedestal.

In one embodiment, said top electrode comprises one of silicon, carbon, silicon carbide, silicon oxide, aluminum oxide, yttrium oxide, or zirconium oxide.

In one embodiment, said RF source power generator comprises a first RF power generator of a VHF frequency and a second RF power generator of a below-VHF frequency.

In one embodiment, said grid filter is conductive, wherein said grid filter is one of: (a) electrically floating, or (b) at a fixed potential.

One embodiment of the plasma reactor further comprises a folded resonator coupled between said first RF power generator and said top electrode. In one embodiment, said folded resonator is coaxial with said side wall.

In one embodiment, said RF source power generator comprises a lower VHF frequency generator having a first VHF frequency and a higher VHF frequency generator having a second VHF frequency greater than said first VHF frequency.

In one embodiment, said grid filter comprises first and second grids facing one another, said plasma reactor further comprising an acceleration voltage source connected to one of said first and second grids.

One embodiment further comprises a first magnet adjacent one of said upper and lower chambers, each circularly shaped and disposed at respective axial locations around said chamber. In the latter embodiment, the reactor further comprises a second magnet, said first and second magnets being adjacent respective ones of said upper and lower chambers, said first and second magnets being circularly shaped and disposed at respective axial locations around said chamber, wherein said first and second magnets produce one of: (a) a cusp-shaped field that is predominantly axial in said upper chamber and predominantly radial in said lower chamber, or (b) an axial field. In the latter embodiment, the reactor further comprises a third magnet, wherein said first and second magnets produce a first cusp-shaped field having a cusp plane at said upper chamber and said second and third magnet produce a second cusp-shaped field having a cusp plane at said lower chamber.

In one embodiment, the reactor further comprises a magnet having a magnetic field in a transverse direction in said lower chamber.

In one embodiment, the reactor further comprises: a window in said side wall; a coil antenna around said window; and an RF generator coupled to said coil antenna.

In one embodiment, the reactor further comprises a remote plasma source having an output coupled to said chamber.

In accordance with a further embodiment, a method of processing a workpiece in an electron beam plasma reactor comprises: dividing a chamber of said reactor into an upper chamber and a lower chamber by a grid filter, and supporting a workpiece in said lower chamber with a surface of said workpiece facing said grid filter along an axis; supplying a gas into said chamber; coupling RF source power into said upper chamber or to an electrode of said upper chamber to generate a plasma including beam electrons in said upper chamber to produce an electron beam having a beam propagation direction corresponding to said axis; allowing flow of at least a portion of said beam electrons from said upper chamber to said lower chamber while preventing flow of at least a portion of non-beam electrons and plasma ions from said upper chamber to said lower chamber; and producing a plasma in said lower chamber from said electron beam.

In one embodiment, the method further comprises supplying a substantially inert gas into said upper chamber and supplying a molecular process gas into said lower chamber.

In one embodiment, said generating a plasma comprises applying RF power to a plasma source electrode underlying a ceiling of said upper chamber, the method further comprising supporting said electrode by electrostatically chucking said plasma source electrode to said ceiling.

In one embodiment, the method further comprises controlling a temperature of said plasma source electrode by circulating a thermally conductive medium inside said ceiling.

In one embodiment, the method further comprises coupling a bias voltage to said workpiece.

In one embodiment, said plasma source electrode comprises one of silicon, carbon, silicon carbide, silicon oxide, aluminum oxide, yttrium oxide, or zirconium oxide.

In one embodiment, said generating a plasma comprises applying RF source power to a plasma source electrode underlying a ceiling of said upper chamber, wherein said RF source power comprises RF power of a first frequency and RF power of a second frequency.

In one embodiment, the method further comprises providing a magnetic field in said chamber from a first magnet comprising either a permanent magnet or an electromagnet. In one embodiment, the method further comprises providing a second magnet, said first and second magnets producing one of a cusp magnetic field or an axial magnetic field.

In one embodiment, said generating a plasma further comprises applying RF source power to a coil antenna around a window in a sidewall of upper chamber.

In a yet further embodiment, a method of performing atomic layer etching using an electron beam plasma source in a process chamber comprises: dividing said process chamber into upper and lower chambers by a grid filter, said upper chamber having a ceiling electrode, and placing a workpiece in said lower chamber having a surface layer to be etched; furnishing a molecular process gas to said chamber; (I) performing a passivation process comprising: (A) performing at least one of: (a) coupling a high power level of VHF power into said upper chamber or to said ceiling electrode, or (b) coupling a high level of inductively coupled power into said upper chamber; and (B) maintaining a bias voltage on said workpiece at zero or below a threshold for etching said surface layer of said workpiece to reduce or prevent etching of the surface layer during the passivation process; (II) performing an etch process comprising: (A) performing at least one of: (a) applying to said ceiling electrode a high level of lower frequency RF power, or (b) reducing or eliminating the power level of at least one of (1) said VHF power or (2) said inductively coupled power; and (B) maintaining a bias voltage on said workpiece above a threshold for etching said surface layer; and (III) repeating said passivation and etch processes in alternating succession.

In one embodiment, said furnishing a molecular process gas to said chamber comprises furnishing said molecular process gas into said lower chamber. In this latter embodiment, the method may further comprise furnishing an inert gas into said upper chamber.

In one embodiment, said furnishing a molecular process gas to said chamber comprises furnishing said molecular process gas into said upper chamber. In this latter embodiment, said passivation process may further comprise furnishing an inert gas into said upper chamber.

In one embodiment, the method further comprises performing said passivation process for a duration corresponding to passivation of a selected depth of material of said surface layer. In one embodiment, said selected depth is one atomic layer.

In one embodiment, said molecular process gas comprises a passivation species.

In one embodiment, during said etch process, said reducing dissociation substantially stops or diminishes passivation of said surface layer of said workpiece.

In one embodiment, during said passivation process, said enhancing dissociation comprises generating an electron beam by ion bombardment of said ceiling electrode, said electron beam propagating from said upper chamber to said lower chamber.

In embodiments, (a) said high level of power of said VHF power is in a range of 300 to 10,000 Watts; (b) said high level of inductively coupled power is in a range of 300 to 10,000 Watts; and (c) said high level of lower frequency RF power is in a range of 300 to 10,000 Watts.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
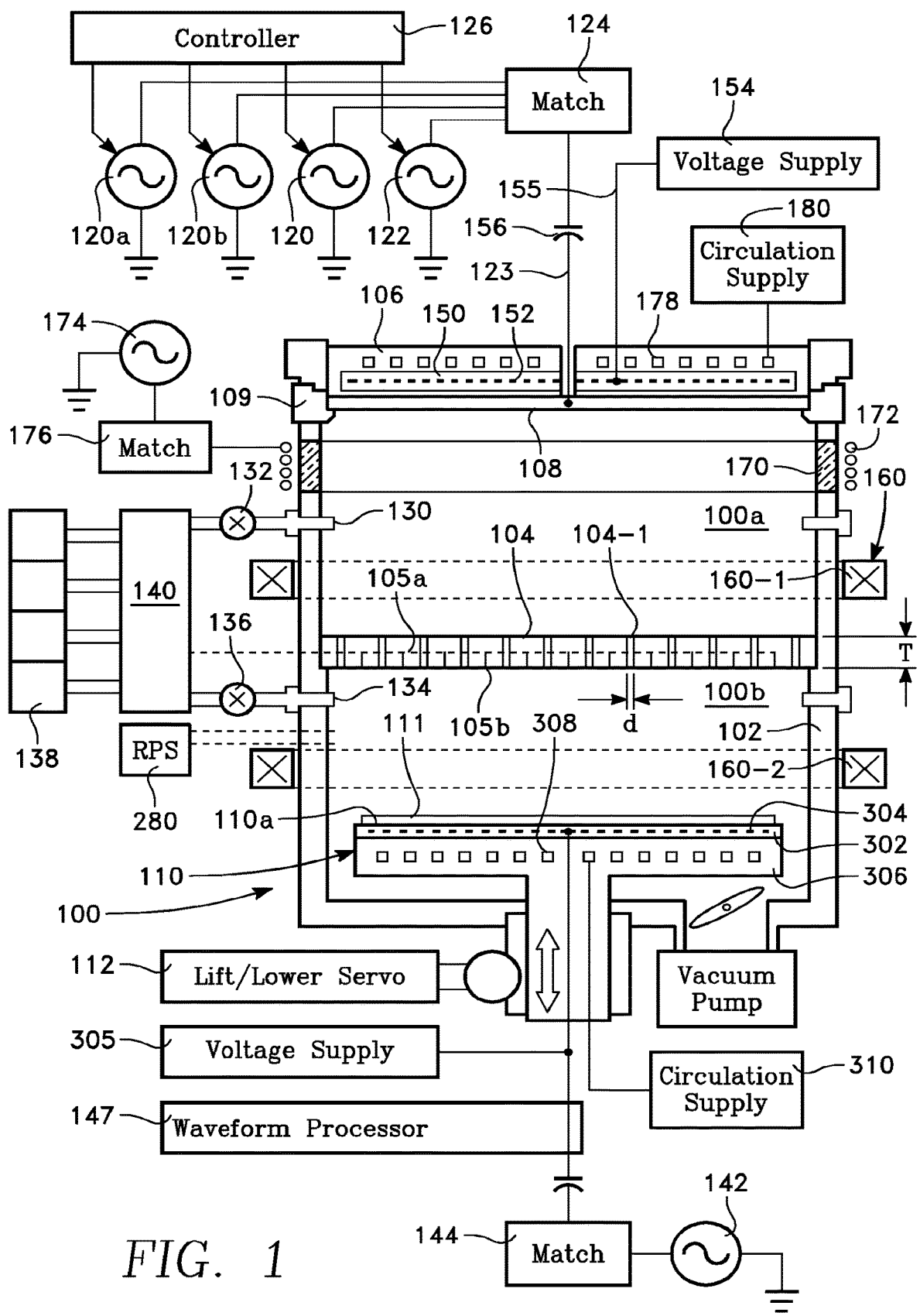
FIG. 1 depicts a plasma reactor in accordance with a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Referring to FIG. 1, an electron beam plasma reactor has a vacuum chamber body defining a chamber 100 including a side wall 102 of cylindrical shape. The chamber 100 is divided by a grid filter 104 into an upper chamber 100a and a lower chamber 100b. The lower chamber 100b is a drift space because of a lack of substantial electric field therein in the absence of an applied bias voltage. A ceiling 106 overlies the upper chamber 100a, and supports an electrode 108. In one embodiment, the electrode 108 is formed of a process-compatible material such as silicon, carbon, silicon carbon compound or a silicon-oxide compound. In an alternative embodiment, the electrode 108 is formed of a metal oxide such as aluminum oxide, yttrium oxide, or zirconium oxide. The ceiling 106 and the electrode 108 may be disk-shaped. A bottom surface of the electrode 108 faces the grid filter 104 and is exposed to the interior of the upper chamber 100a. In one embodiment, an insulator or dielectric ring 109 surrounds the electrode 108.

A workpiece support pedestal 110 for supporting a workpiece 111 in the lower chamber 100b has a workpiece support surface 110a facing the grid filter 104 and may be movable in the axial direction by a lift servo 112. In one embodiment, the workpiece support pedestal 110 includes an insulating puck 302 forming the workpiece support surface 110a, a workpiece electrode 304 inside the insulating puck 302, and a chucking voltage supply 305 connected to the workpiece electrode 304. Additionally, a base layer 306 underlying the insulating puck 302 has internal passages 308 for circulating a thermal medium (e.g., a liquid) from a circulation supply 310. The circulation supply 310 may function as a heat sink or as a heat source.

An RF power generator 120 having a VHF frequency (e.g., 160 MHz) and a lower frequency RF power generator 122 having a frequency below the VHF range or below the HF range (e.g., in the MF or LF range, e.g., 2 MHz) are coupled to the electrode 108 through an impedance match 124 via an RF feed conductor 123. In one embodiment, the impedance match 124 is adapted to provide an impedance match at the different frequencies of the RF power generators 120 and 122, as well as filtering to isolate the power generators from one another. The output power levels of the RF generators 120, 122 are independently controlled by a controller 126. As will be described in detail below, power from the RF power generators 120, 122 is coupled to the electrode 108. In one embodiment, the ceiling 106 is electrically conductive and is in electrical contact with the electrode 108, and the power from the impedance match 124 is conducted through the ceiling 106 to the electrode 108. In one embodiment, the side wall 102 is formed of metal and is grounded. In one embodiment, the surface area of grounded internal surfaces inside the upper chamber 100a is at least twice the surface area of the electrode 108. In one embodiment, the grounded internal surfaces inside the chamber 100 may be coated with a process compatible material such as silicon, carbon, silicon carbon compound or a silicon-oxide compound. In an alternative embodiment, grounded internal surfaces inside the chamber 100 may be coated with a material such as aluminum oxide, yttrium oxide, or zirconium oxide.

In one embodiment, the RF power generator 120 may be replaced by two VHF power generators 120a and 120b that are separately controlled. The VHF generator 120a has an output frequency in a lower portion (e.g., 30 MHz to 150 MHz) of the VHF band, while the VHF generator 120b has an output frequency in an upper portion (e.g., 150 MHz to 300 MHz) of the VHF band. The controller 126 may govern plasma ion density by selecting the ratio between the output power levels of the VHF generators 120a and 120b. With the two VHF power generators 120a and 120b, radial plasma uniformity in the upper chamber 100a can be controlled by selecting the gap of upper chamber 100a (the distance between the electrode 108 and the grid filter 104) such that by itself the lower VHF frequency produces an edge-high radial distribution of plasma ion density in the upper chamber 100a and by itself the upper VHF frequency produces a center-high radial distribution of plasma ion density. With such a selection, the power levels of the two VHF power generators 120a, 120b are then set to a ratio at which uniformity of radial distribution of plasma ion density is optimized.

In one embodiment, the ceiling 106 is a support for the electrode 108 and includes an insulating layer 150 containing a chucking electrode 152 facing the electrode 108. A D.C. chucking voltage supply 154 is coupled to the chucking electrode 152 via the feed conductor 155, for electrostatically clamping the electrode 108 to the ceiling 106. A D.C. blocking capacitor 156 may be connected in series with the output of the impedance match 124. The controller 126 may control the D.C. chucking voltage supply 154. In one embodiment, the RF feed conductor 123 from the impedance match 124 may be connected to the electrode support or ceiling 106 rather than being directly connected to the electrode 108. In such an embodiment, RF power from the RF feed conductor 123 may be capacitively coupled from the electrode support to the electrode 108.

In one embodiment, upper gas injectors 130 provide process gas into the upper chamber 100a through a first valve 132. In one embodiment, lower gas injectors 134 provide process gas into the lower chamber 100b through a second valve 136. Gas is supplied from an array of process gas supplies 138 through an array of valves 140 which may include the first and second valves 132 and 136, for example. In one embodiment, gas species and gas flow rates into the upper and lower chambers 100a, 100b are independently controllable. The controller 126 may govern the array of valves 140. In one embodiment, an inert gas is supplied into the upper chamber 100a and a process gas is supplied into the lower chamber 100b. The inert gas flow rate may be selected to substantially prevent convection or diffusion of gases from the lower 100b into the upper chamber 100a, providing substantial chemical isolation of the upper chamber 100a.

In one embodiment, plasma may be produced in the upper chamber 100a by various bulk and surface processes, including energetic ion bombardment of the interior surface of the top electron-emitting electrode 108. The ion bombardment energy of the electrode 108 and the plasma density are functions of both RF power generators 120 and 122. The ion bombardment energy of the electrode 108 may be substantially controlled by the lower frequency power from the RF power generator 122 and the plasma density in the upper chamber 100a may be substantially controlled (enhanced) by the VHF power from the RF power generator 120. Energetic secondary electrons may be emitted from the interior surface of the electrode 108. The flux of energetic electrons from the emitting surface may comprise an electron beam, and may have a direction substantially perpendicular to the interior surface of the electrode 108, and a beam energy of approximately the ion bombardment energy of the electrode 108, which typically can range from about 10 eV to 5000 eV. The collision cross-sections for different processes depend upon the electron energy. At low energies, cross-sections for excitation (and dissociation in molecular gases) are larger than for ionization, while at high energies the reverse is true. The RF power level(s) may be advantageously selected to target various inelastic electron collision processes.

In another embodiment having optional RF source generator 174 and coil antenna 172, the plasma density in the upper chamber 100a may be substantially controlled (enhanced) by the RF power from the RF power generator 174.

In one embodiment, the grid filter 104 is of a flat disk shape and may be coaxial with the side wall 102. The grid filter 104 is formed with an array of plural openings 104-1.

In one embodiment, the axial thickness T of the grid filter 104 and the diameter, d, of the plural openings 104-1 are selected to promote flow through the grid filter 104 of energetic directed beam electrons while impeding flow of non-beam (low energy) electrons and plasma ions through the grid filter 104, and the ratio of grid filter hole area to total grid filter area may be maximized. The energetic electron flux (electron beam) may pass through the grid filter 104 to the lower chamber 100b and may produce a plasma by various electron impact processes in the lower chamber 100b.

The plasma produced by the electron beam in the lower chamber 100b may have different characteristics from the plasma in the upper chamber 100a. The grid filter 104 may function as a filter to substantially electrically isolate the upper and lower chambers 100a, 100b from one another. In one embodiment, the grid filter 104 is formed of a conductive or semiconductive material, and may be connected to ground or may be electrically floating. In another embodiment, the grid filter 104 is formed of a non-conductive material. In one embodiment, the grid filter 104 may be coated with a process compatible material such as silicon, carbon, silicon carbon compound or a silicon-oxide compound. In an alternative embodiment, grid filter 104 may be coated with a material such as aluminum oxide, yttrium oxide, or zirconium oxide. In one embodiment, the plasma produced in the upper chamber 100a may have high electron density and/or high electron temperature, and have high energy ions impinging on the electrode 108.

At least a portion of the electron beam, comprised of the secondary electron flux emitted from electrode 108 due to energetic ion bombardment of the electrode surface, propagates through the grid filter 104 and into the lower chamber 100b, producing a low electron temperature plasma in the lower chamber 100b, with a plasma density that depends upon beam energy and flux, as well as other factors such as pressure and gas composition. The energetic beam electrons may impinge upon the workpiece 111 or workpiece support pedestal 110 upon leaving the plasma region of the lower chamber 100b. The plasma left behind may readily discharge any resultant surface charge caused by the electron beam flux.

In one embodiment, an electronegative or electron-attaching gas such as Chlorine is furnished into the chamber, RF and/or VHF power is applied to the electrode 108, RF power is optionally applied to coil antenna 172, RPS power is optionally applied to a remote plasma source (RPS) 280, a plasma is generated in the upper chamber 100a and an accelerating voltage is developed on the electrode 108 with respect to ground and with respect to the plasma. The resulting energetic ion bombardment of the electrode 108 produces secondary electron emission from electrode surface, which constitutes an electron beam flux from the electrode surface. The grid filter 104 allows at least a portion of the electron beam to propagate through the grid filter 104 and into the lower chamber 100b, while preventing at least a portion of non-beam electrons and plasma ions from passing through the grid filter 104, producing a low electron temperature plasma in the lower chamber 100b. The resultant low electron temperature plasma in the lower chamber 100b in an electronegative gas such as Chlorine may produce a highly electronegative plasma, with negative ion densities much higher than electron densities and approaching densities of positive ions. Such a plasma is commonly called an ion-ion plasma.

A substantially axially-directed magnetic field, substantially parallel to the electron beam, may be optionally used to help guide the electron beam, improving beam transport through the upper chamber 100a, the grid filter 104 and/or the lower chamber 100b. A low frequency bias voltage or arbitrary waveform of low repetition frequency may be applied to the workpiece support pedestal 110 (e.g., to the workpiece electrode 304) to selectively or alternately extract positive and/or negative ions from said plasma and accelerate those ions at desired energy levels to impact the surface of the workpiece 111 for etching, cleaning, deposition, or other materials modification. Radicals produced (a) in the upper chamber 100a, (b) by the electron beam in the lower chamber 100b, (c) by the application of bias voltage to the workpiece support pedestal 110, or (d) by the remote plasma source (RPS) 280, may convect or diffuse to the workpiece 111 and participate in reaction on the workpiece surface.

In another embodiment, a relatively inert gas such as Helium or Argon is furnished into the upper chamber 100a, an electronegative or electron-attaching gas such a Sulfur Hexafluoride is flowed into the lower chamber 100b, RF and/or VHF power is applied to the electrode 108, RF power is optionally applied to coil antenna 172, RPS power is optionally applied to the RPS 280, a plasma is generated in the upper chamber 100a and an accelerating voltage is developed on the electrode 108 with respect to ground and with respect to the plasma. The resulting energetic ion bombardment of the electrode 108 produces secondary electron emission from electrode surface, which constitutes an electron beam flux from the electrode surface. The grid filter 104 allows at least a portion of the electron beam to propagate through the grid filter 104 and into the lower chamber 100b, while preventing at least a portion of non-beam electrons and plasma ions from passing through the grid filter 104, producing a low electron temperature plasma in the lower chamber 100b.

The resultant low electron temperature plasma in the lower plasma chamber in an electronegative gas such as Sulfur Hexafluoride may produce a highly electronegative plasma, with negative ion densities much higher than electron densities and approaching densities of positive ions, commonly called an ion-ion plasma. A substantially axially-directed magnetic field, substantially parallel to the electron beam, may be optionally used to help guide the electron beam, improving beam transport through the upper chamber 100a, the grid filter 104 and/or the lower chamber 100b. A low frequency bias voltage or arbitrary waveform of low repetition frequency may be applied to the workpiece support pedestal 110 to selectively or alternately extract positive and/or negative ions from the plasma and accelerate the ionic species at desired energy levels to impact the workpiece surface for etching, cleaning, deposition, or other materials modification. Radicals produced (a) in the upper chamber 100a, (b) by the electron beam in the lower chamber 100b, (c) by the application of bias voltage to the workpiece support pedestal 110, or (d) by the RPS 280 may convect or diffuse to the workpiece 111 and participate in reaction on the workpiece surface.

In one embodiment, the grid filter 104 is a gas distribution plate, having internal gas passages 105a and gas injection outlets 105b. The internal gas passages 105a may be coupled to the array of valves 140.

In one embodiment, an RF bias power generator 142 is coupled through an impedance match 144 to the workpiece electrode 304 of the workpiece support pedestal 110. In a further embodiment, a waveform tailoring processor 147 may be connected between the output of the impedance match 144 and the workpiece electrode 304. The waveform tailoring processor 147 changes the waveform produced by the RF bias power generator 142 to a desired waveform. The ion energy of plasma near the workpiece 111 is controlled by the waveform tailoring processor 147. In one embodiment, the waveform tailoring processor 147 produces a waveform in which the amplitude is held during a certain portion of each RF cycle at a level corresponding to a desired ion energy level. The controller 126 may control the waveform tailoring processor 147.

In one embodiment, a magnet 160 surrounds the chamber 100. In one embodiment, the magnet comprises a pair of magnets 160-1, 160-2 adjacent the upper and lower chambers 100a, 100b, respectively. In one embodiment, the pair of magnets 160-1, 160-2 provides an axial magnetic field suitable for confining an electron beam that is propagating from the upper chamber 100a to the lower chamber 100b.

In one embodiment, a side window 170 in the side wall 102 faces the upper chamber 100a and is formed of a material (e.g., quartz or aluminum oxide) through which RF power may be inductively coupled. An inductive coil antenna 172 surrounds the side window 170 and is driven by an RF power generator 174 through an impedance match 176. The remote plasma source 280 may introduce plasma species into the lower chamber 100b.

In one embodiment, flow of energetic electrons to the workpiece 111 is blocked by a magnetic field having a predominantly radial component (i.e., transverse to the electron beam flow direction) in the region between the grid filter 104 and the workpiece 111. This magnetic field may be produced by one of the magnets 160-1 or 160-2, or by another magnet or set of magnets.

In one embodiment, internal passages 178 for conducting a thermally conductive liquid or media inside the ceiling 106 are connected to a thermal media circulation supply 180. The thermal media circulation supply 180 acts as a heat sink or a heat source. The mechanical contact between the electrode 108 and the ceiling 106 is sufficient to maintain high thermal conductance between the electrode 108 and the ceiling 106. In the embodiment of FIG. 1, the force of the mechanical contact is regulated by the electrostatic clamping force provided by the D.C. chucking voltage supply 154.

Figure 1A:
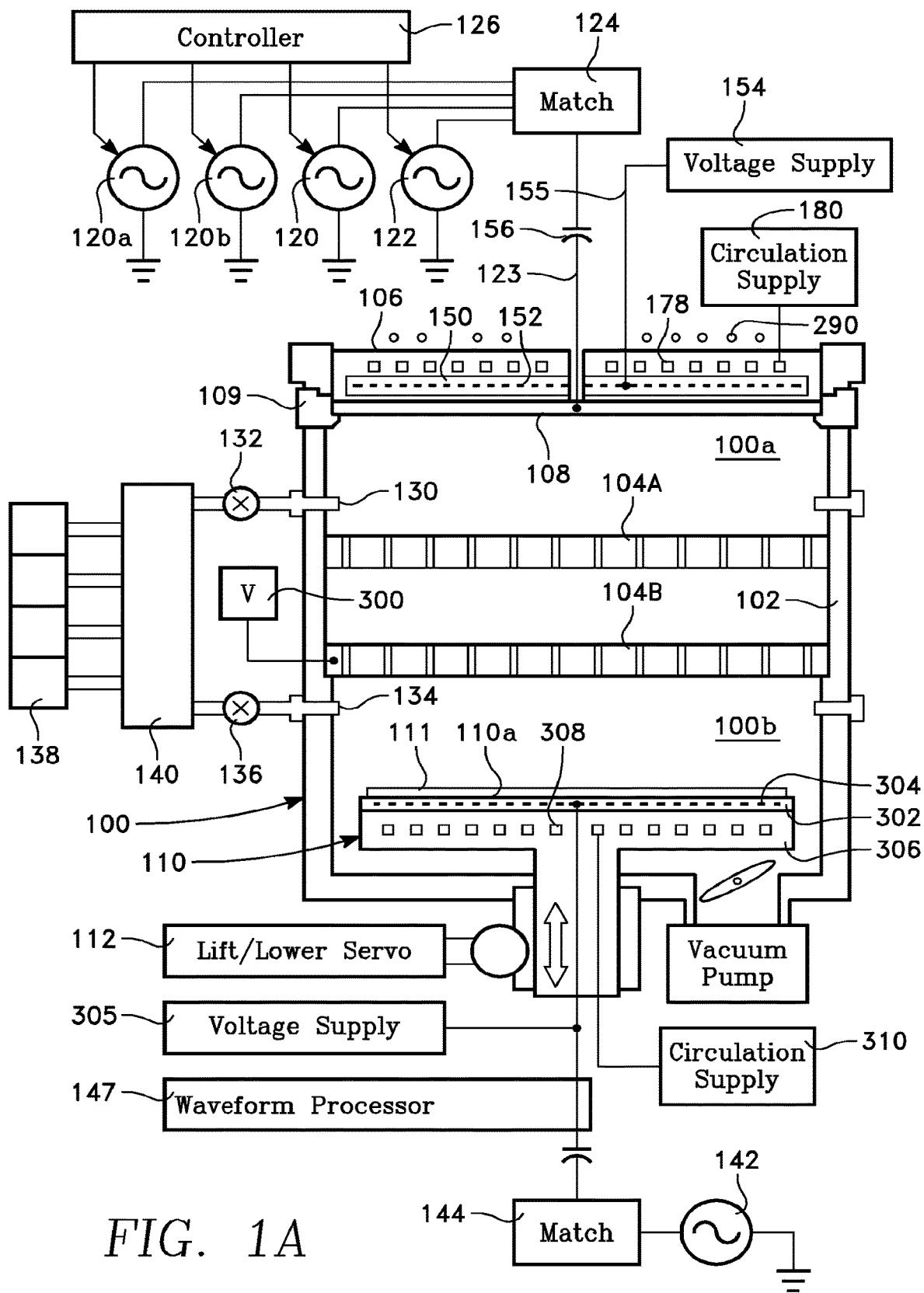
FIG. 1A depicts a modification of the plasma reactor of FIG. 1 having a pair of grids.

In one embodiment depicted in FIG. 1A, the grid filter 104 is replaced by two grids, namely an upper grid filter 104A and a lower grid filter 104B spaced apart from one another. In one embodiment, the upper and lower grid filters 104A, 104B are conductive and may be held at different voltages. For example, the upper grid filter 104A may be grounded while an acceleration voltage supply 300 may be connected to the lower grid filter 104B.

In an alternative embodiment, an RF-driven coil antenna 290 may be provided over the ceiling 106.

Figure 2:
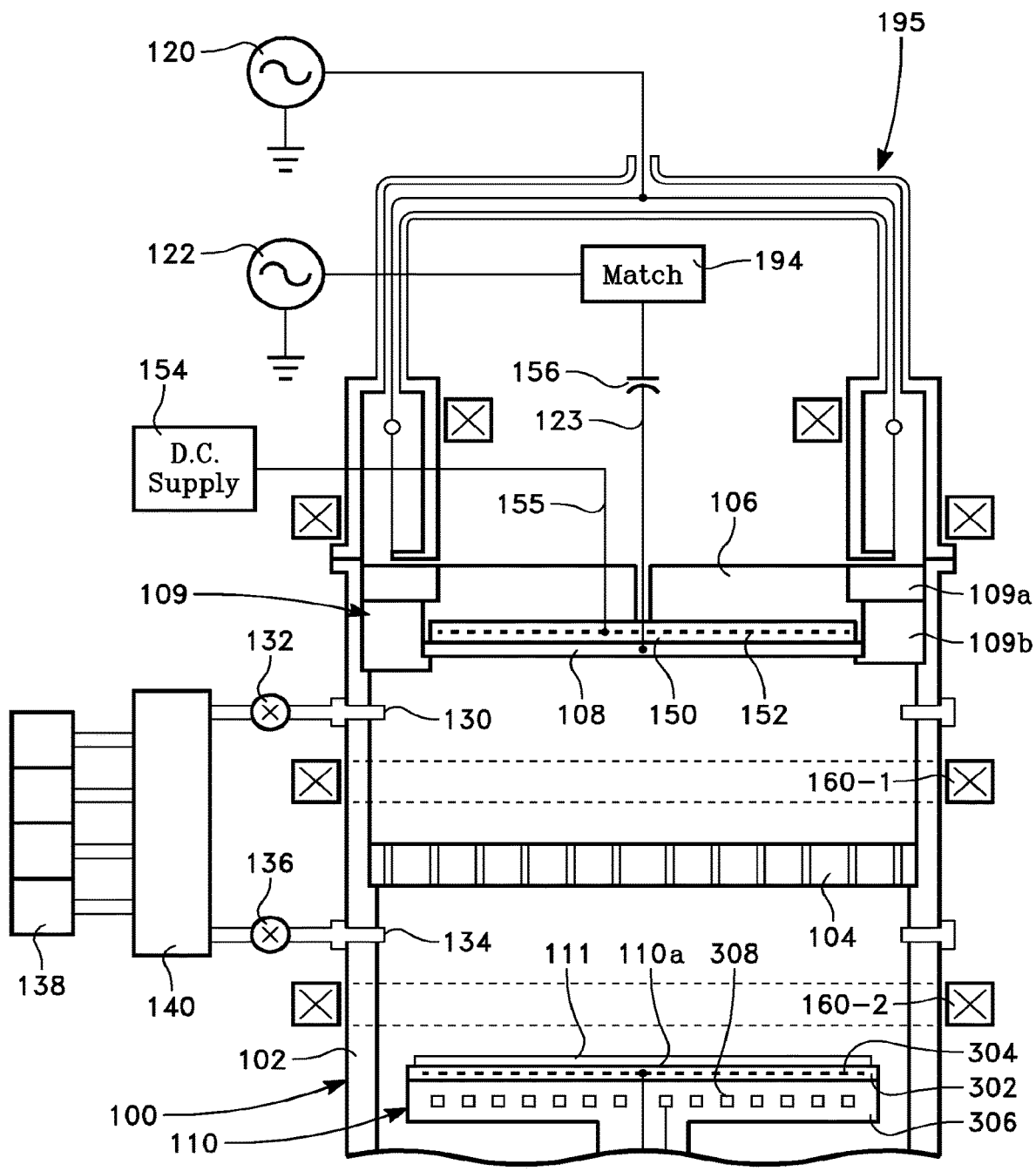
FIG. 2 depicts a plasma reactor in accordance with a second embodiment.

FIG. 2 depicts a modification of the embodiment of FIG. 1 in which the VHF power (from the RF generator 120) and the lower frequency RF power (from the RF generator 122) are delivered to the electrode 108 through separate paths. In the embodiment of FIG. 2, the RF generator 120 is coupled to the electrode 108 through a folded resonator 195 overlying an edge of the electrode 108. The lower frequency RF generator 122 is coupled to the electrode 108 via the RF feed conductor 123 through an RF impedance match 194. The D.C. chucking voltage supply 154 is coupled to the chucking electrode 152 through the feed conductor 155 extending through a passage in the ceiling 106.

Figure 3:
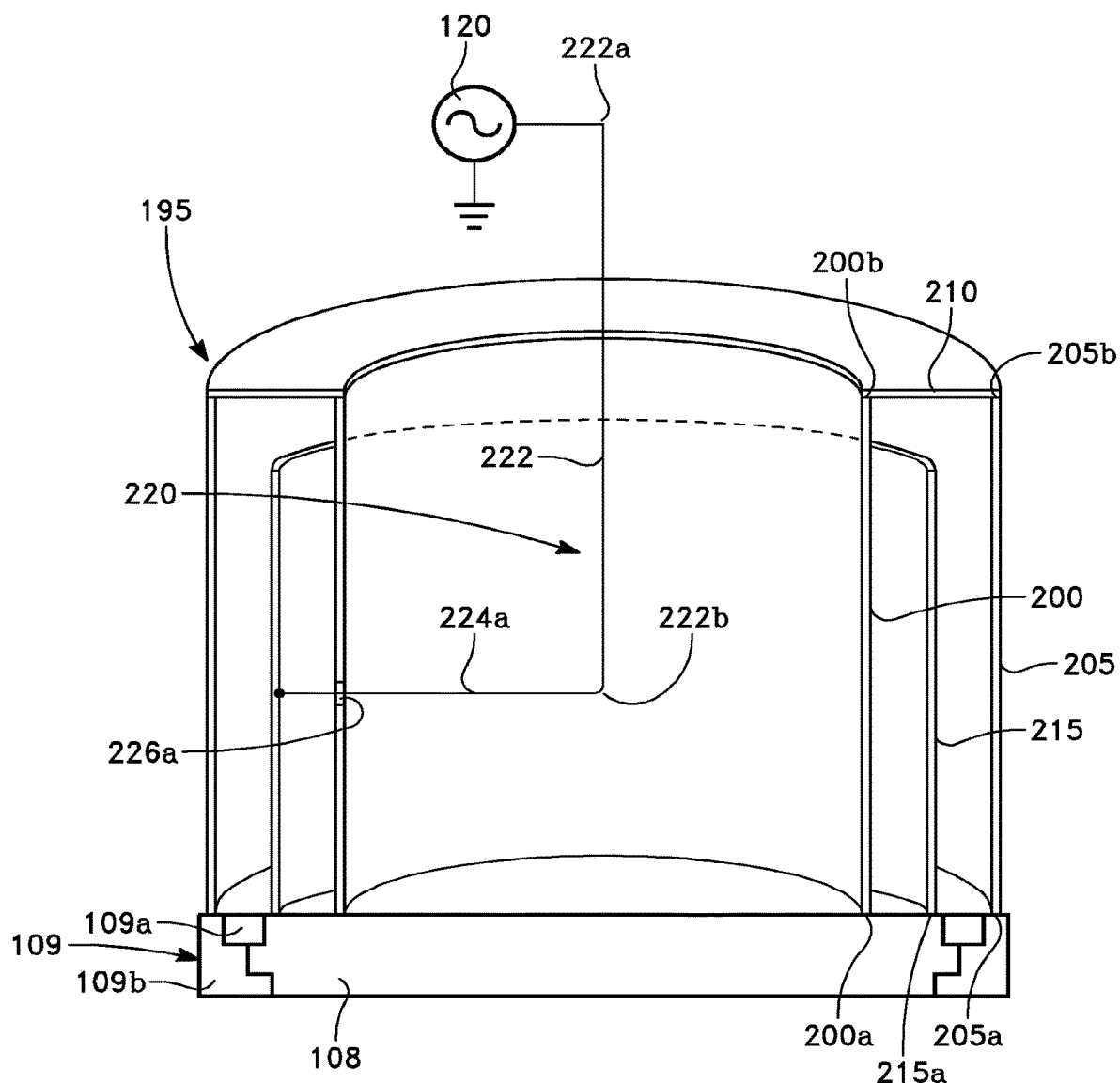
FIG. 3 is a partially cut-away elevational view of a VHF resonator employed in the embodiment of FIG. 2.
Figure 4:
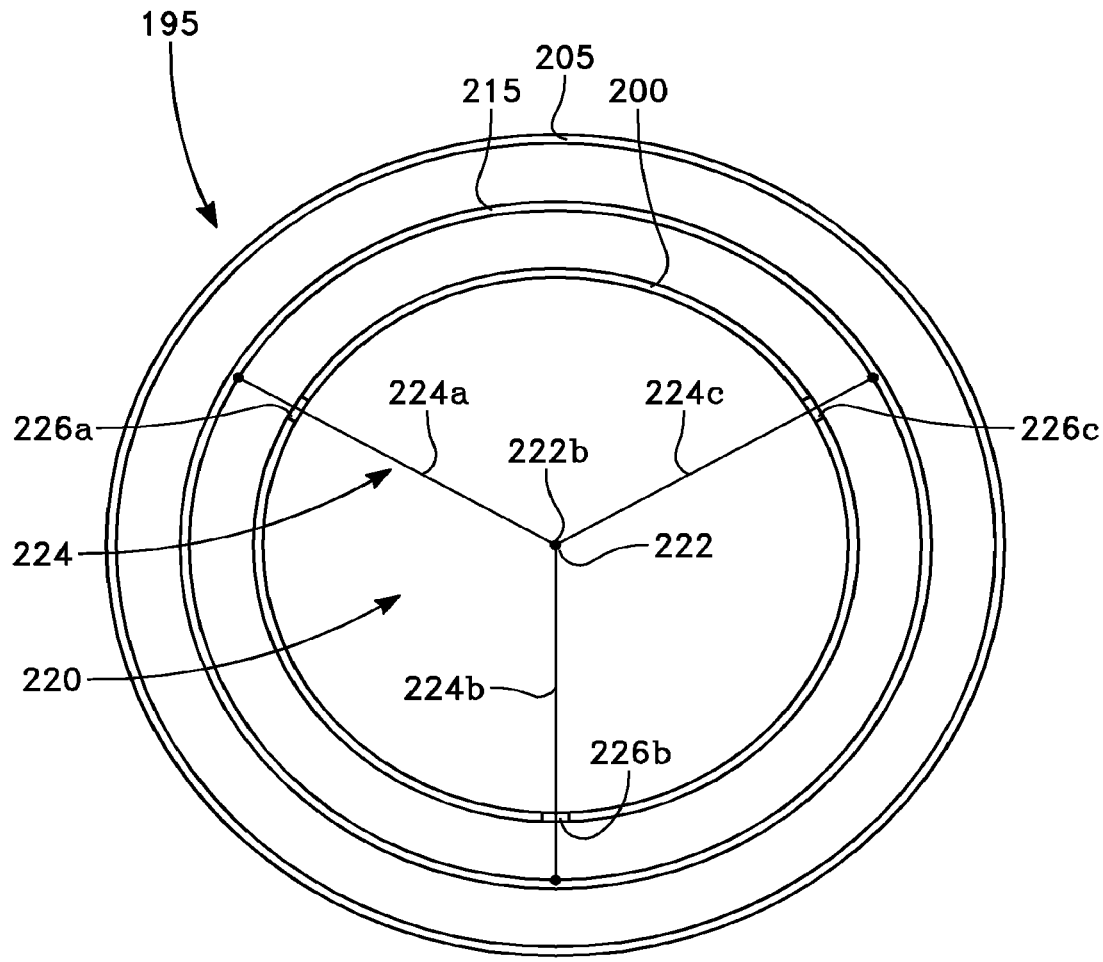
FIG. 4 is a plan view corresponding to FIG. 3.

One embodiment of the folded resonator 195 of FIG. 2 is now described with reference to FIGS. 3 and 4. The folded coaxial resonator 195 includes an inner conductive hollow cylinder 200 that is coaxial with the ceiling electrode 108. The inner conductive hollow cylinder 200 has a circular bottom edge 200a electrically contacting the top surface of the ceiling electrode 108. The folded coaxial resonator 195 further includes an outer conductive hollow cylinder 205 having a circular bottom edge 205a contacting the top surface of a dielectric ring 109 that surrounds the periphery of the electrode 108. The dielectric ring 109 may consist of an insulating support ring 109a and an insulating clamp ring 109b beneath the insulating support ring 109a. The inner and outer conductive cylinders 200, 205 are of at least approximately the same axial length, so that their circular top edges 200b, 205b are at the same height above the ceiling electrode 108. The folded coaxial resonator 195 also includes a planar conductive annulus 210 resting upon and electrically connecting the circular top edges 200b, 205b of the inner and outer conductive hollow cylinders 200, 205. The folded coaxial resonator 195 further includes a center conductive hollow cylinder 215 coaxial with the inner and outer hollow conductive cylinders 200, 205 and located between them. Preferably, the radius of the center conductive hollow cylinder 215 may be the geometric mean of the radii of the inner and outer hollow conductive cylinders 200, 205. The center conductive hollow cylinder 215 has a circular bottom edge 215a resting on and in electrical contact with the top surface of the electrode 108.

A VHF power coupler 220 conducts VHF power from the RF generator 120 to the center hollow conductive cylinder 215. Thus, the center hollow conductive cylinder 215 is the RF-fed conductor of the folded coaxial resonator 195, while the inner and outer hollow conductive cylinders 200, 205 together with the planar conducive annulus 210 are analogous to a grounded outer conductor of a simple coaxial resonator. The electrical connection of the bottom circular edges 200a, 215a to the ceiling electrode 108 provides the requisite D.C. short, equivalent to the D.C. short at the end of a simple (unfolded) coaxial tuning stub.

The VHF power coupler 220 includes an axial conductor 222 extending through a top portion of the hollow inner cylinder 200 from a top end 222a outside of the hollow inner cylinder 200 to a bottom end 222b inside of the inner cylinder 200. A first spoke conductor 224a extends radially from the axial conductor bottom end 222b through a hole 226a in the inner cylinder 200 to the center cylinder 215. As depicted in FIG. 4, there are a plurality of spoke conductors 224a, 224b, 224c, symmetrically arranged and extending radially from the axial conductor bottom end 222b, through respective holes 226a, 226b, 226c in the inner cylinder 200 and to the center cylinder 215 to which their outer ends are electrically connected. In the illustrated embodiment, there are three spoke conductors 224 disposed at 120 degree intervals, although any suitable number n of spoke conductors 224 may be provided at 360/n degree intervals.

Figure 5A:
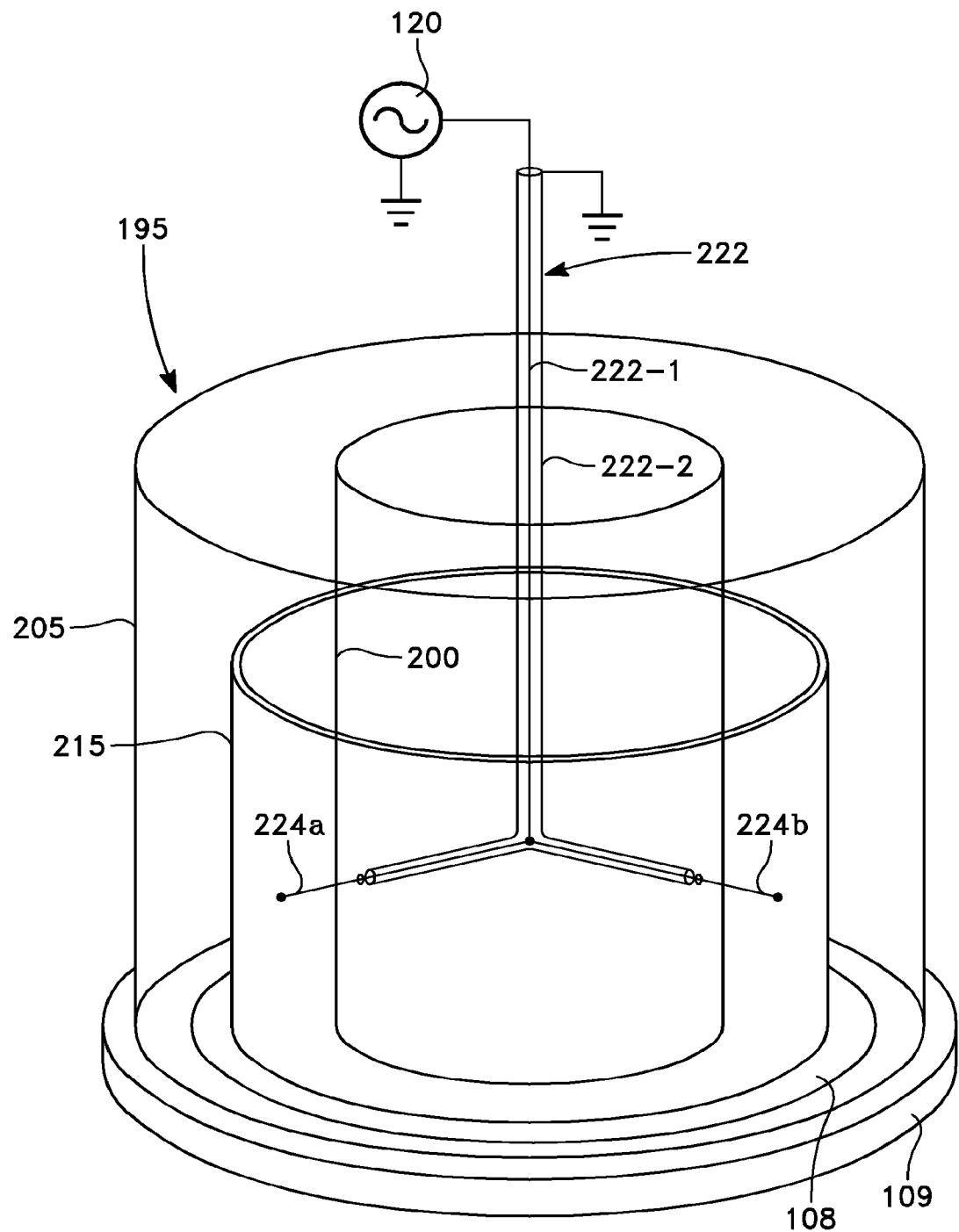
FIG. 5A is an orthographic projection of a second embodiment of the VHF resonator of FIG. 3.
Figure 5B:
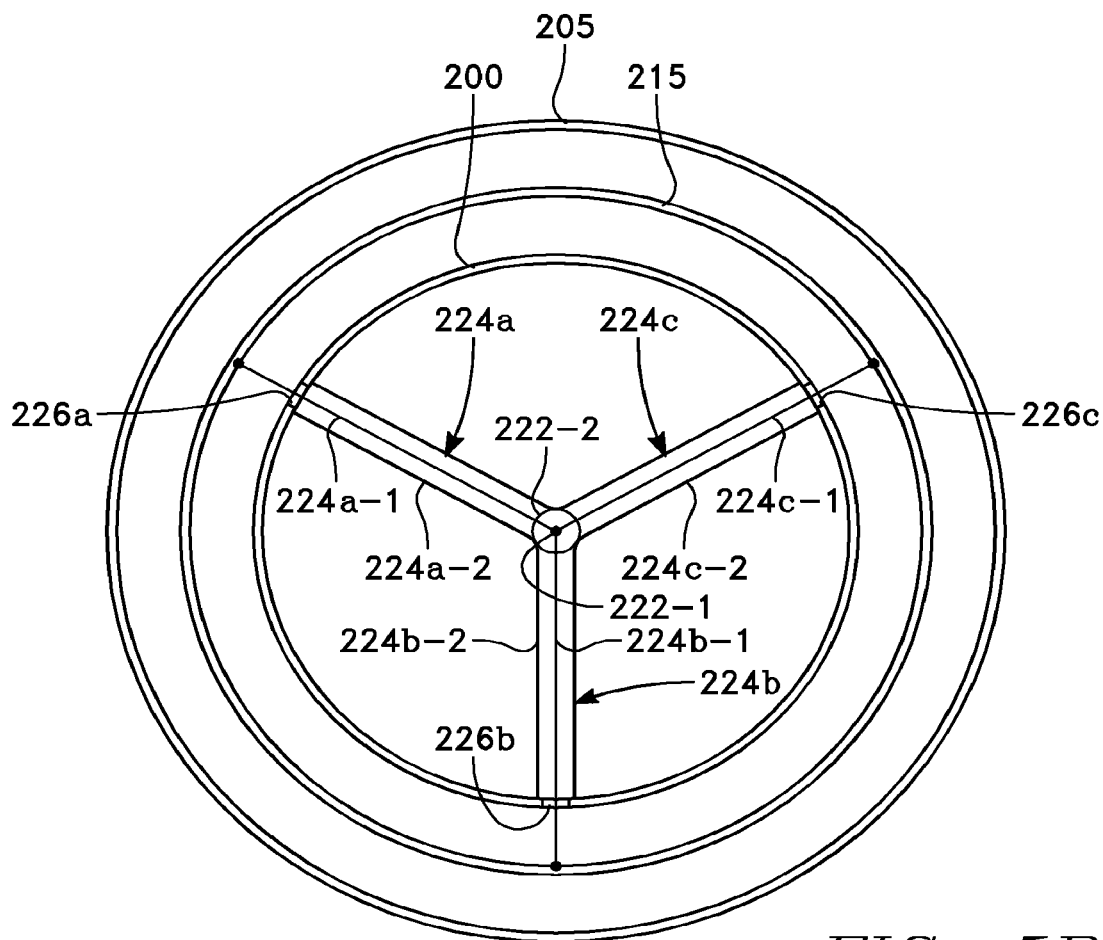
FIG. 5B is a plan view corresponding to FIG. 5A.
Figure 5C:
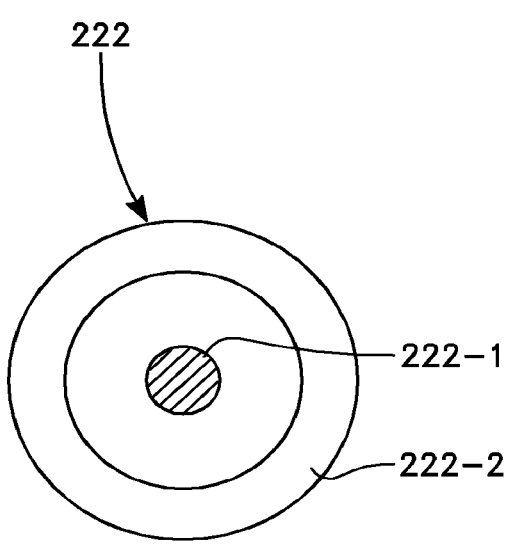
FIG. 5C is an enlarged view of a portion of FIG. 5A.

In one embodiment, the VHF power coupler 220 is provided as a coaxial structure in which the axial conductor 222 and each of the spoke conductors 224 is a coaxial transmission line including a center conductor that is RF hot, surrounded by a grounded outer conductor or shield. This coaxial structure is depicted in FIGS. 5A and 5B, and is compatible with the field-free environment of the interior of the inner hollow conductive cylinder 200. In the embodiment of FIGS. 5A and 5B, the axial conductor 222 consists of a center axial conductor 222-1 connected to the output of the VHF generator 120, and a grounded outer axial conductor 222-2 surrounding the center axial conductor 222-1. FIG. 5C depicts a cross-sectional view of the axial conductor 222.

In the embodiment of FIGS. 5A-5C, each of the spoke conductors 224a, 224b, 224c embodies a coaxial transmission line structure. Thus, the spoke conductor 224a consists of a center spoke conductor 224*a*-1 and an outer spoke conductor 224*a*-2 surrounding the center spoke conductor 224*a*-1. The center spoke conductor 224*a*-1 extends radially from the axial center conductor 222-1 and terminates at and is electrically connected to the center cylinder 215. The center spoke conductor 224*a*-1 is RF hot by reason of its connection to the axial center conductor 222-1. The outer spoke conductor 224*a*-2 extends from the grounded axial outer conductor 222-2 and is terminated at (and electrically connected to) the inner cylinder 200. The center spoke conductor 224*a*-1 passes through the hole 226*a* (without contacting the inner conductive cylinder 200) to contact the center conductive cylinder 215.

The structure of each of the spoke conductors 224*a*, 224*b*, 224*c* is the same. Thus, the spoke conductor 224*b* consists of a center spoke conductor 224*b*-1 and an outer spoke conductor 224*b*-2 surrounding the center spoke conductor 224*b*-1. The center spoke conductor 224*b*-1 extends radially from the axial center conductor 222-1 and terminates at the center cylinder 215. The center spoke conductor 224*b*-1 is RF hot by reason of its connection to the axial center conductor 222-1. The outer spoke conductor 224*b*-2 extends from the grounded axial outer conductor 222-2 and is terminated at (and electrically connected to) the inner cylinder 200, while the center spoke conductor 224*b*-1 passes through the hole 226*b* (without contacting the inner conductive cylinder 200) to contact the center conductive cylinder 215.

In like manner, the spoke conductor 224*c* consists of a center spoke conductor 224*c*-1 and an outer spoke conductor 224*c*-2 surrounding the center spoke conductor 224*c*-1. The center spoke conductor 224*c*-1 extends radially from the axial center conductor 222-1 and terminates at the center cylinder 215. The center spoke conductor 224*c*-1 is RF hot by reason of its connection to the axial center conductor 222-1. The outer spoke conductor 224*c*-2 extends from the grounded axial outer conductor 222-2 and is terminated at (and electrically connected to) the inner cylinder 200, while the center spoke conductor 224*c*-1 passes through the hole 226*c* (without contacting the inner conductive cylinder 200) to contact the center conductive cylinder 215.

The plural spoke center conductors 224*a*-1, 224*b*-1 and 224*c*-1 extend in the radial direction from the axial center conductor 222-1 to electrically contact the center conductive cylinder 215. The area of this contact defines a circular plane. The axial location of this circular plane is selected to be such that the electrical or RF impedance at this location matches the characteristic impedance of 224*a*, 224*b* and 224*c*, respectively, at the VHF frequency of the RF generator 120. The characteristic impedance of the individual spoke conductors 224*a*, 224*b* and 224*c* is selected such that their total impedance at the junction (222*b*) matches the output impedance of the VHF generator 120 at the frequency of the VHF generator 120.

Figure 6:
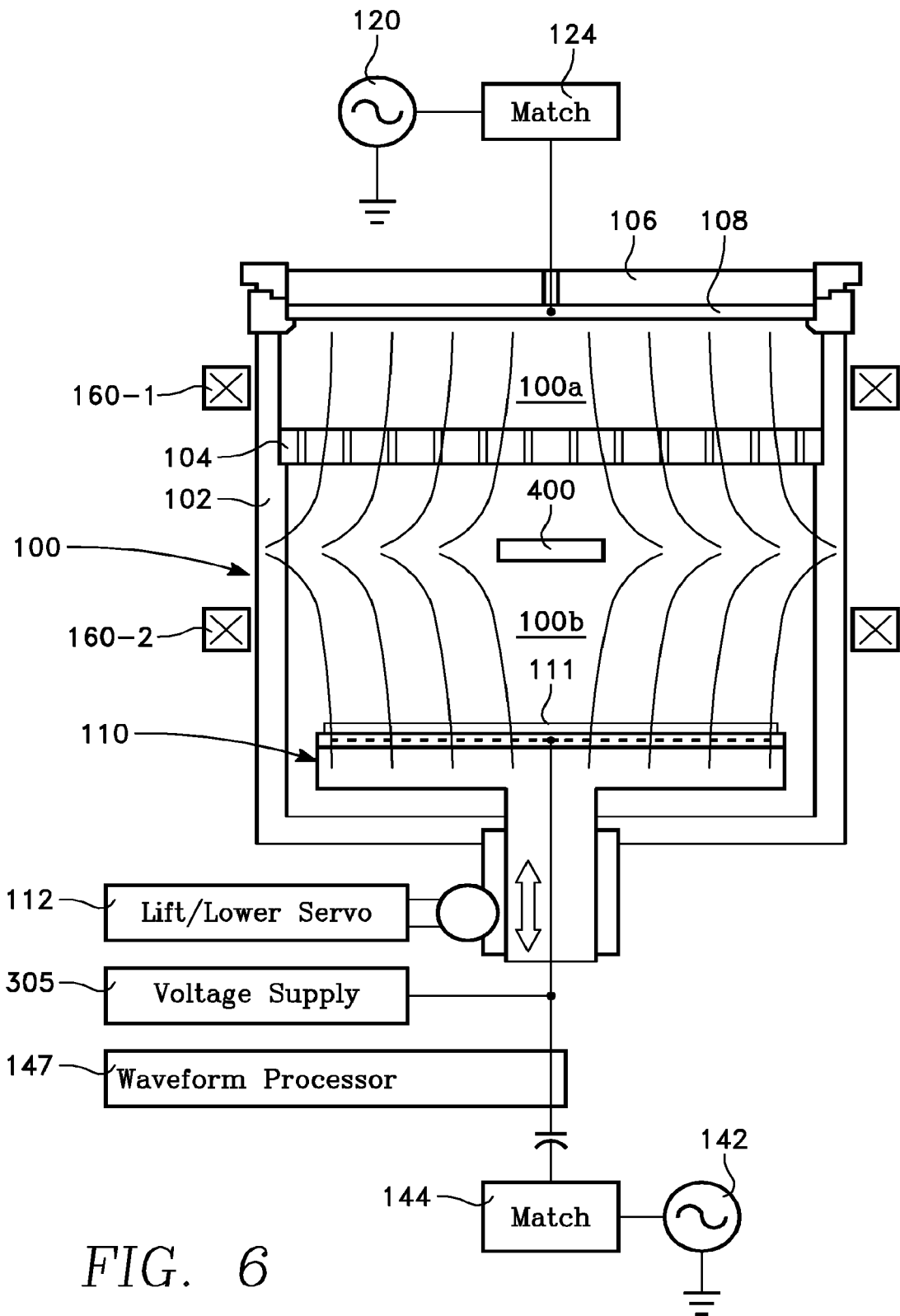
FIG. 6 depicts an embodiment having a cusp-shaped magnetic field as a magnetic filter.

FIG. 6 depicts a cusp-shaped magnetic field produced by the magnets 160-1 and 160-2 in one embodiment. The cusp-shaped magnetic field is predominantly radial in the lower chamber 100*b* and therefore diverts electrons from reaching the workpiece 111. The cusp-shaped magnetic field is axial in a small region in the center. In order to avoid leakage of energetic electrons through the center portion the field due to the predominantly axial form of the field in the center, a center shield or blocker 400 may be provided.

Figure 7:
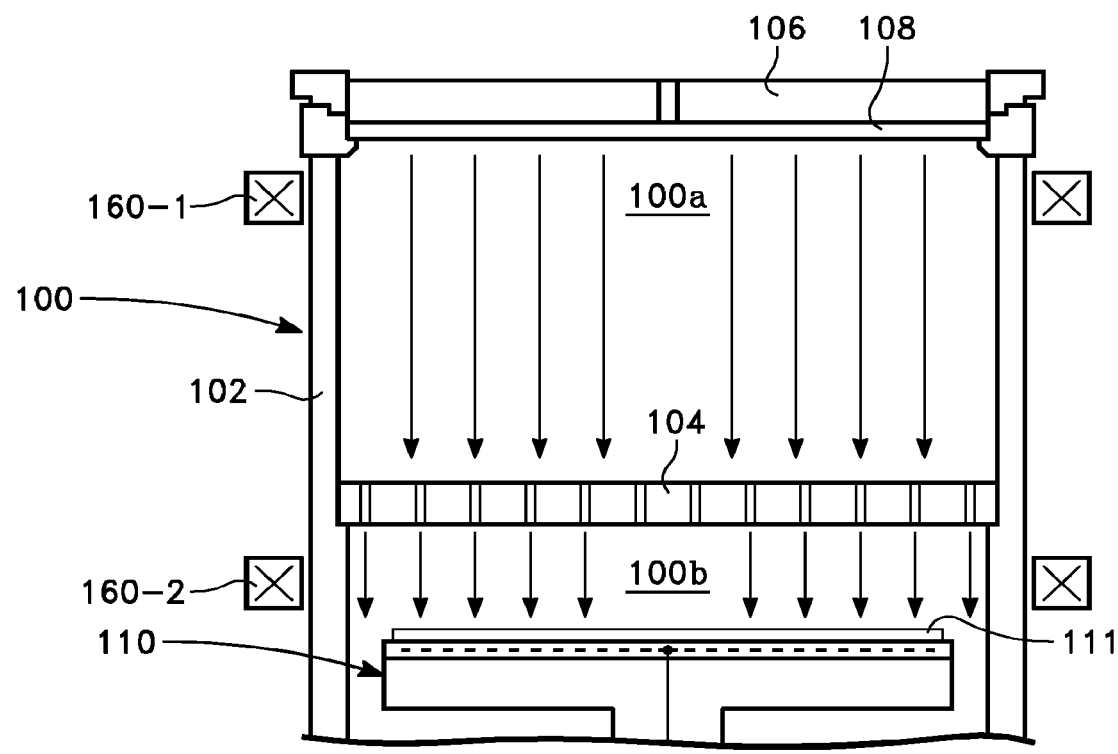
FIG. 7 depicts an embodiment having an axial magnetic field for confining an electron beam.

FIG. 7 depicts an axial-shaped magnetic field produced by the magnets 160-1 and 160-2 in another embodiment. The axial magnetic field is effective for confining the electron beam along an axial path.

Figure 8:
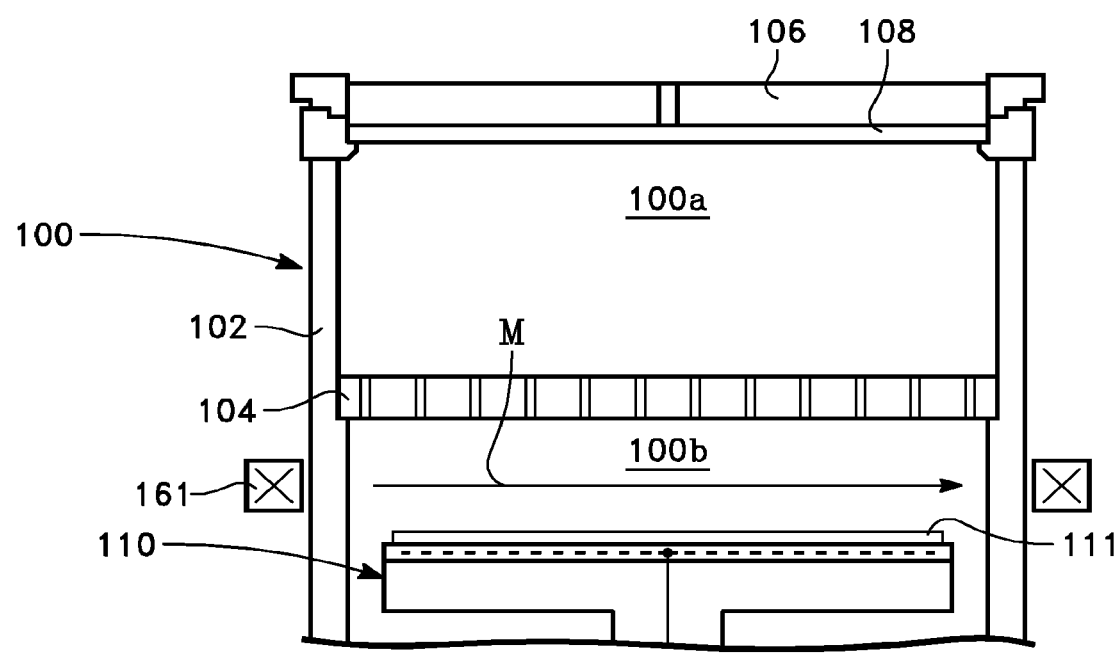
FIG. 8 depicts an embodiment having a transverse magnetic field as a magnetic filter.

FIG. 8 depicts a transverse magnetic field M produced in the lower chamber 100*b* by a magnet 161, for diverting electrons from reaching the workpiece 111. The magnet 161 may be implemented as a Halbach array, for example. The magnet 161 may be a circular array of electromagnets so that the transverse magnetic field M may be electrically rotated about the axis of cylindrical symmetry of the chamber 100, to enhance process uniformity.

Figure 9:
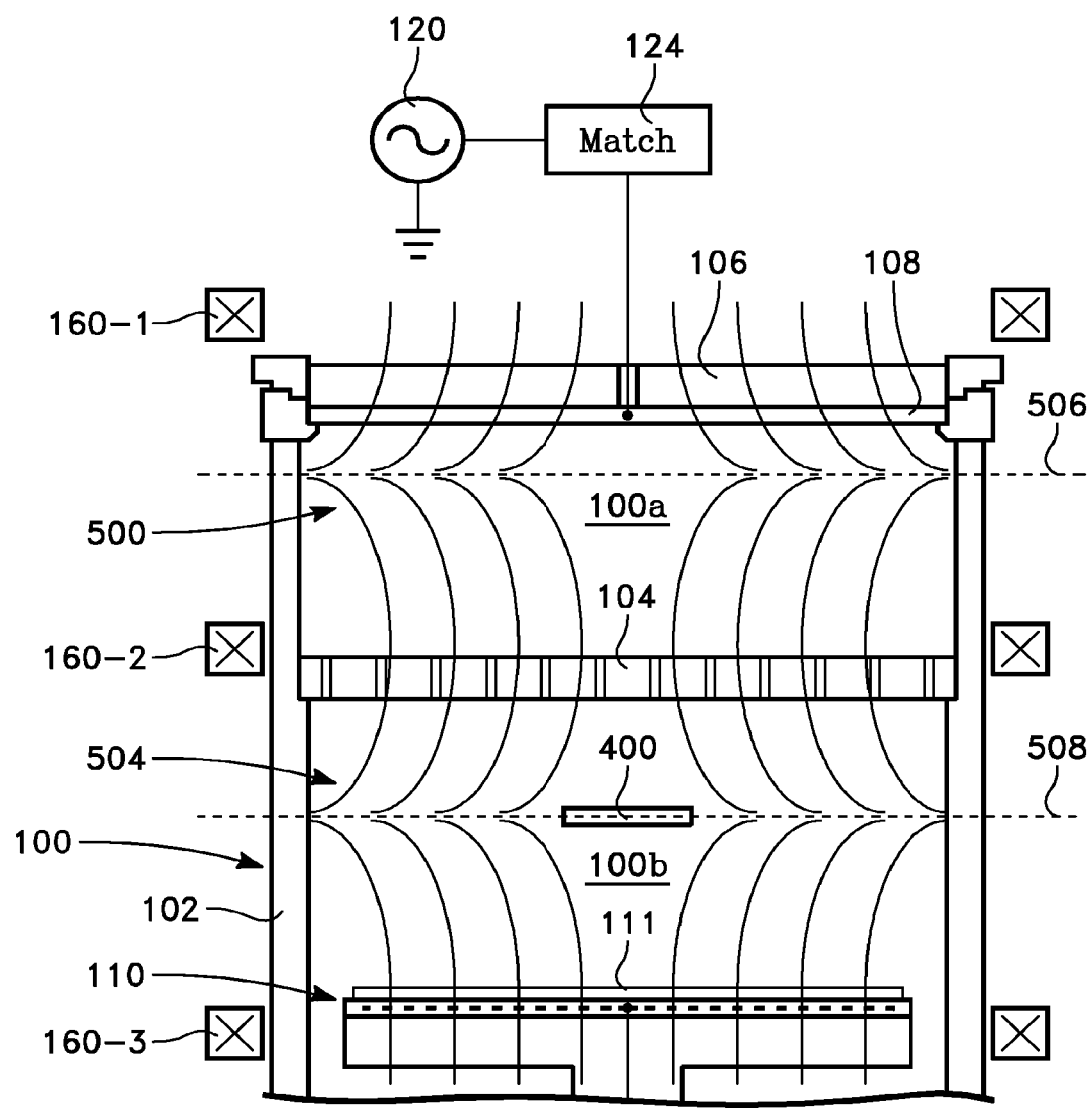
FIG. 9 depicts an embodiment having an upper cusp-shaped magnetic field for confining plasma near the ceiling electrode and a lower cusp-shaped magnetic field as a magnetic filter.

FIG. 9 depicts a magnetic field including an upper cusp-shaped magnetic field 500 produced by magnets 160-1 and 160-2 in the upper chamber 100*a* and a lower cusp-shaped magnetic field 504 produced by magnets 160-2 and 160-3 in the lower chamber 100*b*. The upper and lower cusp-shaped magnetic fields 500, 504 have respective planes of symmetry 506, 508 above and below the grid filter 104, respectively. The upper cusp-shaped field 500 helps confine plasma near the electrode 108. The lower cusp-shaped magnetic field 504 is predominantly radial in the lower chamber 100*b* and therefore diverts electrons from reaching the workpiece 111. The cusp field is axial in a small region in the center. In order to avoid leakage of energetic electrons through the center portion the field due to the predominantly axial form of the field in the center, a center shield or blocker 400 may be provided in the lower chamber 100*b*.

Figure 10:
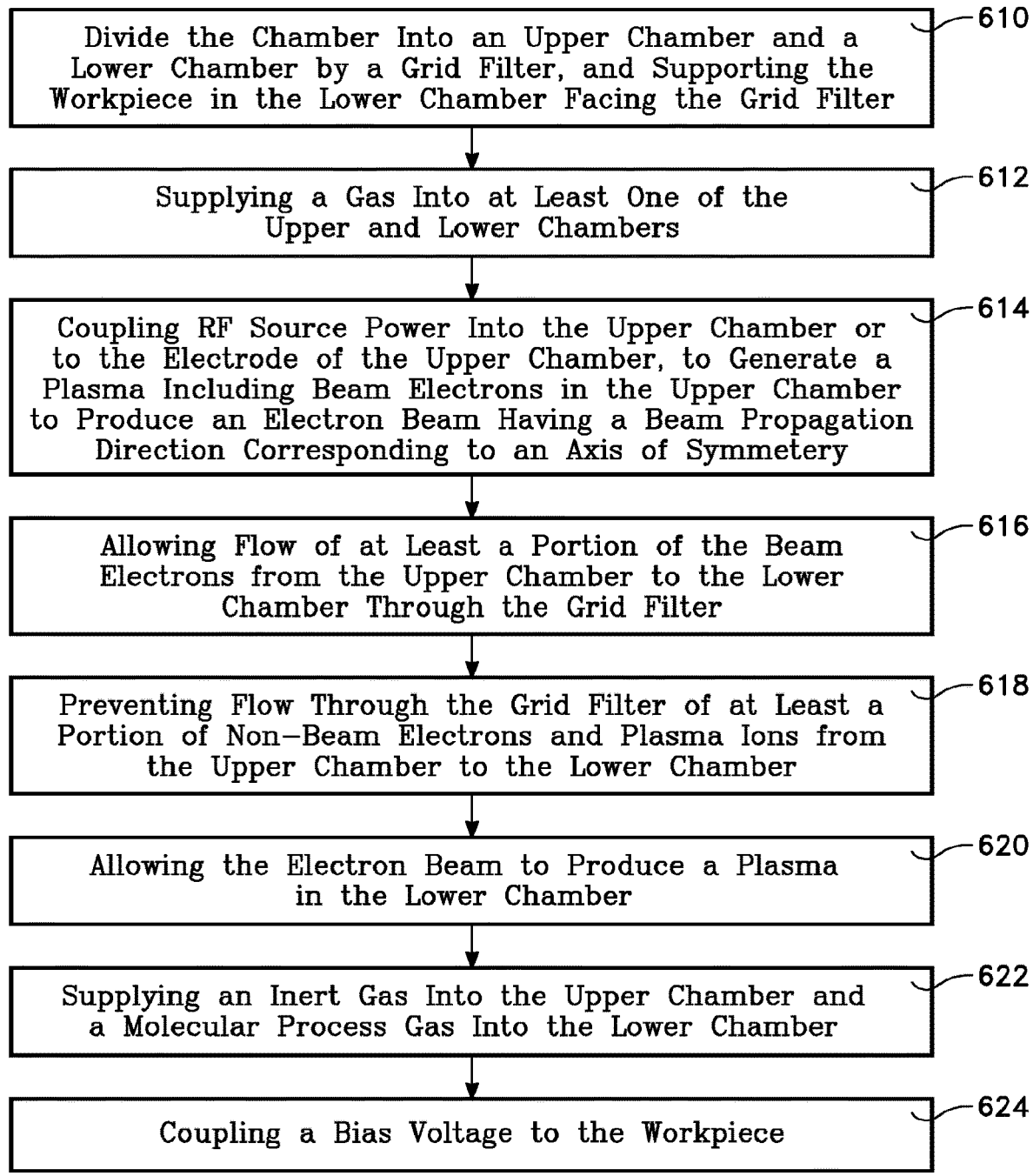
FIG. 10 is a block diagram depicting a method in accordance with an embodiment.

Any one of the electron beam plasma reactors of FIG. 1, FIG. 1A or FIG. 2 may be employed to carry out the following method of processing a workpiece in an electron beam plasma reactor. Referring now to FIG. 10, the grid filter 104 is provided to divide the chamber 100 into an upper chamber 100*a* and a lower chamber 100*b* (block 610 of FIG. 10), while supporting the workpiece 111 in the lower chamber 100*b* facing the grid filter 104. A gas is supplied into at least one of the upper and lower chambers 100*a*, 100*b* (block 612 of FIG. 10). RF source power into the upper chamber 100*a* or to the electrode 108 to generate a plasma including beam electrons in the upper chamber 100*a* to produce an electron beam having a beam propagation direction corresponding to the axis of symmetry (block 614 of FIG. 10). The method further includes allowing flow of at least a portion of the beam electrons from the upper chamber 100*a* to the lower chamber 100*b* through the grid filter 104 (block 616 of FIG. 10) while preventing flow through the grid filter 104 of at least a portion of non-beam electrons and plasma ions from the upper chamber 100*a* to the lower chamber 100*b* (block 618 of FIG. 10). The method further includes allowing the electron beam to produce a plasma in the lower chamber 100*b* (block 620 of FIG. 10). The method can further include supplying a substantially inert gas into the upper chamber 100*a* and supplying a molecular process gas into the lower chamber 100*b* (block 622 of FIG. 10). The method can further include coupling a bias voltage to the workpiece 111 (block 624 of FIG. 10).

Atomic Layer Etching:

The reactor of FIG. 1 or FIG. 1A or FIG. 2 may be employed to perform an atomic layer etch process. In one example, the workpiece 111 includes a semiconductive bulk layer (e.g., monocrystalline Silicon), an overlying layer (e.g., an oxide of Silicon) and a surface layer (e.g., polycrystalline Silicon), which may be partially masked. In this process, one of the gas supplies 138 contains a precursor of an etch species (e.g., Argon gas), while another one of the gas supplies 138 contains a precursor of a passivation species (e.g., Chlorine gas). The passivation species is produced by dissociation (in a plasma) of the passivation precursor species (e.g., the Chlorine gas). Passivation is performed by exposing the workpiece 111 to the passivation species. Generally, the surface layer of the workpiece 111 is not readily etched (or is not susceptible to etching) by the etch species at the selected energy. Passivation renders the surface layer of the workpiece susceptible to etching by the etch species. The depth of the passivated portion of the surface layer is determined by the time of exposure to the passivation species. In this process, the time of exposure to the passivation species is set to a duration in which one atomic layer is passivated. Then, the workpiece 111 is exposed to the etch species, to remove the one atomic layer. Thereafter the foregoing sequence is repeated to remove the next atomic layer. This cycle is repeated until a desired portion (e.g., 100%) of the surface layer has been removed, one atomic layer at a time. The process thus consists of alternating phases of passivation and etching.

Referring now to FIG. 1, FIG. 1A or FIG. 2, in one embodiment, an inert gas such as Argon is furnished to the upper chamber 100*a*, and a molecular process gas such as Chlorine is furnished to the lower chamber 100*b*. As described above with reference to FIG. 1, the plasma is sustained by various bulk and surface processes, including energetic ion bombardment of the electrode 108 by plasma ions. The density of the plasma is primarily controlled by the power level of the VHF power from the RF power generator 120 or by the power level of the RF power generator 174 powering the optional RF coil antenna 172, while the ion bombardment energy on the electrode 108 and thus the resultant secondary electron beam energy is primarily controlled by the power level of the lower frequency power from the RF power generator 122. During the passivation phase, high power level in a range of 300 to 10,000 Watts of VHF power from the RF power generator 120 (or optionally from the RF power generator 174 powering the optional RF coil antenna 172) produces a plasma in the upper chamber 100*a*.

The foregoing examples of high power levels are for a reactor that processes workpieces of 200 mm to 300 mm diameter, while larger substrates would use higher power levels. The voltage on the electrode 108, which may be optionally increased by additional application of RF power from the VHF power generator 120*b* to the electrode 108, accelerates an electron beam, which propagates through the grid filter 104 into the lower chamber 100*b*, producing a plasma in the lower chamber 100*b*. The high flux, low energy, electron beam conditions in the lower chamber 100*b* enhance dissociation of at least a portion of molecular Chlorine into atomic Chlorine radicals, electrons and ions. Due to the low electron temperature plasma, in the absence of applied workpiece bias, the ion energy is below the threshold for etching silicon and passivation of the workpiece surface occurs without significant etching. Next, in the etching phase, at least one of: (A) a high level of lower frequency RF power (in a range of 300 to 10,000 Watts) is applied to the electrode 108, or (B) low or no VHF power is applied to the electrode 108, or (C) low or no RF power is applied to the coil antenna 172. Low power in this instance is in a range below 300 Watts. The foregoing example of high power level is for a reactor that processes workpieces of 200 mm to 300 mm diameter, while larger substrates would use higher power levels. The higher voltage on the electrode 108 accelerates a higher energy electron beam, which propagates through the grid filter 104 into the lower chamber 100*b*, producing a plasma in the lower chamber 100*b*. The high energy electron beam conditions in the lower chamber 100*b* enhance ionization and reduce dissociation of molecular Chlorine into atomic Chlorine radicals, electrons and ions. In addition, Argon neutrals, which have flowed through the grid filter 104 to the lower chamber 100*b*, may be ionized by beam electrons. Bias voltage is turned on (applied to the workpiece support pedestal 110) during the etching phase at a voltage corresponding to an energy sufficient to etch silicon in the presence of surface Chlorine passivation species, but insufficient to etch silicon in the absence of the passivation species, and ionic etchant species (Argon or Chlorine ions) may be extracted and accelerated into the workpiece surface, promoting etching. The cycle is then repeated.

Alternatively or additionally, the remote plasma source (RPS) 280 may provide passivation radicals. In an alternative variation of embodiments described in detail above, Chlorine is furnished to the upper chamber 100*a* (and optionally Argon is furnished into the upper and or lower chambers 100*a* and 100*b*), and Chlorine radicals are generated in the upper chamber 100*a* by the application of high power level VHF power from the RF power generator 120 (or optionally high power level from the RF power generator 174 powering the optional RF coil antenna 172). The high VHF power to the electrode 108 or the optional power to the coil antenna 172 is used during passivation, while lower frequency RF power to the electrode 108 (at low or no VHF power or coil power) is used in conjunction with workpiece bias voltage during the etching phase.

During the etching phase described above, the RF power coupled to the electrode 108 may be a low frequency RF power or the frequency may be of a higher frequency, e.g., VHF.

Figure 11:
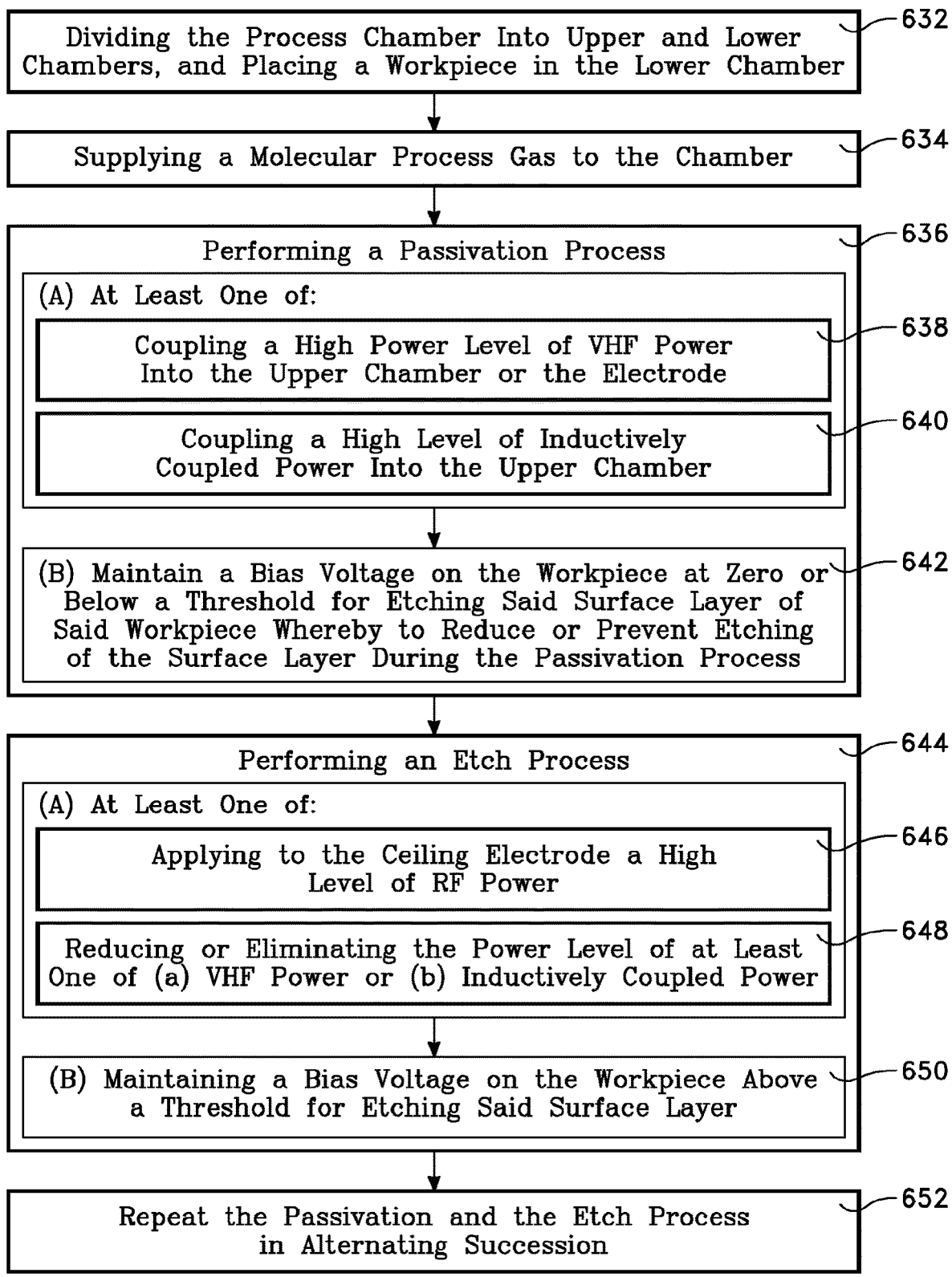
FIG. 11 is a block diagram depicting an atomic layer etch method in accordance with an embodiment.

A method is provided for performing atomic layer etching using an electron beam plasma reactor of the type described above with reference to FIG. 1, 1A or 2. The method is depicted in FIG. 11. Referring to FIG. 11, a grid filter 104 divides the process chamber 100 into the upper and lower chambers 100*a*, 100*b*, and a workpiece is placed in the lower chamber 100*b* (block 632 of FIG. 11). A molecular process gas is supplied to the chamber 100 (block 634 of FIG. 11). A passivation process is performed (block 636 of FIG. 11) and consists of: (A) performing at least one of: (a) coupling a high power level of VHF power into said upper chamber 100*a* or to the electrode 108 (block 638 of FIG. 11), or (b) coupling a high level of inductively coupled power into the upper chamber 100*a* (block 640 of FIG. 11); and (B) maintaining a bias voltage on the workpiece at zero or below a threshold for etching said surface layer of said workpiece to reduce or prevent etching of the surface layer during the passivation process (block 642 of FIG. 11).

After the passivation process, an etch process is performed (block 644 of FIG. 11) as follows: (A) performing at least one of: (a) applying to said ceiling electrode a high level of lower frequency RF power, (block 646 of FIG. 11) or (b) reducing or eliminating the power level of at least one of (1) said VHF power or (2) said inductively coupled power (block 648 of FIG. 11); and (B) maintaining a bias voltage on said workpiece above a threshold for etching said surface layer (block 650 of FIG. 11).

Thereafter, the method consists of repeating the passivation and etch processes in alternating succession (block 652 of FIG. 11).

The molecular process gas may be furnished into the lower chamber 100*b*. Additionally, the method can further includes furnishing an inert gas into the upper chamber 100*a*. Alternatively, the molecular process gas may be furnished into the upper chamber 100*a*.

Advantages:

The cylindrical symmetry of the VHF and RF power flow to the ceiling and the cylindrical symmetry of the electron beam distribution over the circular workpiece optimize azimuthal uniformity in processing. The RF or VHF powered electrode provides a plasma source for generating the electron beam and does not require non-insulating surfaces for electrode or ground return. The electrode 108 may be consumable in certain plasma processes and as such the support structure, which may include an electrostatic chuck, allows for fast electrode replacement and chamber maintenance recovery, while ensuring repeatable electrical and thermal electrode performance, crucial for process stability. The grid filter 104 provides separation between the upper and lower chambers 100a, 100b, enabling control of the workpiece processing environment in the lower chamber 100b independently of the plasma source environment of the upper chamber 100a. The upper and lower gas injectors 130 and 134 enable independent distribution of different gases or gas species to the upper and lower chambers 100a, 100b. For example, one gas (e.g., a "source" gas) particularly useful for producing a species desired in the upper chamber 100a is injected into the upper chamber 100a, while another gas needed for processing the workpiece 111 (e.g., a "process" gas) is injected into the lower chamber 100b. Gas may also be injected through the gas injection outlets 105b of the grid filter 104. For example, an inert gas may be injected through the gas injection outlets 105b of the grid filter 104 so as to substantially prevent process gas in the lower chamber 100b from convecting or diffusing into the upper chamber 100a. In an embodiment where molecular gas is provided to the upper chamber 100a, the dissociation of species in the upper chamber 100a may be enhanced by the application of higher VHF power to the electrode 108 or by the application of RF power to the inductive coil antenna 172 without needing to expose the workpiece 111 to a plasma with high ion density. The electron beam energy and flux may be adjusted to control relative dissociation and ionization processes: In an embodiment where inert gas is flowed into upper chamber 100a and molecular gas is flowed to lower chamber 100b, RF and/or VHF power to the electrode 108 and/or RF power to the coil antenna 172 may be adjusted to adjust electron beam energy and flux to the lower chamber 100b for relative control of dissociation and ionization processes in the lower chamber 100b. The population of radicals or dissociated species may be enhanced by the remote plasma source 280. Unlike a commonly used dc discharge, RF capacitively coupled plasma or inductively coupled plasma, with which a low electron temperature plasma may not be produced continuously (may be produced intermittently during the off-time of a pulsed dc or RF CCP/ICP discharge), the foregoing embodiments may produce a low electron temperature plasma continuously, with high uniformity over the workpiece 111 in the lower chamber 100b. Furthermore, with electronegative gas, an electron deficient, highly electronegative "ion-ion" plasma may be produced continuously, with high uniformity over the workpiece, and with the application of low frequency bias voltage or low repetition frequency arbitrary voltage waveform applied to the workpiece support pedestal 110, positive and/or negative ions may be selectively or alternately extracted from plasma and accelerated at desired energy levels into workpiece surface for etching, cleaning, deposition, or other materials modification processes.

While the foregoing is directed to embodiments of the present invention, other and further embodiments may be devised without departing from the basic scope thereof, and the scope thereof is determined by the claims that follow.

What is claimed is:

1. A method of processing a workpiece in an electron beam plasma reactor, said method comprising:
dividing a chamber of said reactor into an upper chamber and a lower chamber by a grid filter, and supporting a workpiece in said lower chamber with a surface of said workpiece facing said grid filter along an axis;
supplying a gas into said chamber;
coupling RF source power into said upper chamber or to an upper electrode of said upper chamber or to an electrode support, to generate a plasma that generates ions that bombard the upper electrode such that the electrode emits beam electrons in said upper chamber to produce an electron beam having a beam propagation direction corresponding to said axis;
allowing flow through the grid filter of at least a portion of said beam electrons from said upper chamber to said lower chamber while preventing flow of at least a portion of non-beam electrons and plasma ions from said upper chamber to said lower chamber such that openings in the grid filter preferentially pass the beam electrons in comparison to the non-beam electrons and plasma ion from the plasma in the upper chamber; and
allowing said electron beam to produce a plasma in said lower chamber.

2. The method of claim 1, wherein the beam electrons impinge an electronegative process gas in the lower chamber to form a plasma in the lower chamber that has a lower electron temperature than the plasma in the upper chamber and provides an electronegative ion-ion plasma.

3. The method of claim 1, wherein the beam electrons are emitted by the upper electrode of said upper chamber to form an electron beam having an electron beam direction substantially perpendicular to an interior surface of the upper electrode.

4. The method of claim 1, further comprising supplying an inert gas into said upper chamber and supplying a molecular process gas into said lower chamber.

5. The method of claim 1, further comprising coupling a bias voltage to said workpiece.

6. The method of claim 1, wherein said electrode comprises one of silicon, carbon, silicon carbide, silicon oxide, aluminum oxide, yttrium oxide, zirconium oxide.

7. The method of claim 1, wherein said RF source power comprises RF power of a first frequency and a RF power of a second frequency.

8. The method of claim 1, further comprising providing a magnetic field in said chamber from a first magnet comprising either a permanent magnet or an electromagnet.

9. The method of claim 1, wherein generating a plasma further comprises applying RF source power to a coil antenna around a window in a sidewall of upper chamber.

10. The method of claim 1, wherein supplying the gas comprises injecting gas through a side wall.

11. The method of claim 1, comprising applying a DC voltage to an electrode support to chuck the upper electrode of the upper chamber to the electrode support.

12. The method of claim 1, comprising supporting said workpiece on an electrically insulated electrostatic chuck.

13. The method of claim 1, comprising applying a voltage between first and second grids of the grid filter to accelerate beam electrons.

14. A method of performing atomic layer etching using an electron beam plasma source in a process chamber, said method comprising:
dividing said process chamber into upper and lower chambers by a grid filter, said upper chamber having a ceiling electrode, and placing a workpiece in said lower chamber having a surface layer to be etched;

furnishing a molecular process gas to said process chamber;

(I) performing a passivation process comprising:
 (A) performing at least one of: (a) coupling 300 to 10,000 Watts of VHF power; into said upper chamber or to said ceiling electrode, or (b) coupling 300 to 10,000 Watts of inductively coupled power into said upper chamber; and
 (B) maintaining a bias voltage on said workpiece at zero or below a threshold for etching said surface layer of said workpiece;

(II) performing an etching process comprising:
 (A) coupling to said ceiling electrode 300 to 10,000 Watts of RF power;
 (B) maintaining a bias voltage on said workpiece above a threshold for etching said surface layer; and (III) repeating said passivation and etching processes in alternating succession.

15. The method of claim 14, wherein said furnishing a molecular process gas to said process chamber comprises furnishing said molecular process gas into said lower chamber.

16. The method of claim 15, further comprising furnishing an inert gas into said upper chamber.

17. The method of claim 14, wherein said furnishing a molecular process gas to said process chamber comprises furnishing said molecular process gas into said upper chamber.

18. The method of claim 17 further comprising furnishing an inert gas into said upper chamber.

* * * * *